United States Patent [19]

Shi

[11] Patent Number: 5,510,743
[45] Date of Patent: Apr. 23, 1996

[54] APPARATUS AND A METHOD FOR RESTORING AN A-LEVEL CLIPPED SIGNAL

[75] Inventor: Qun Shi, Teaneck, N.J.

[73] Assignee: Panasonic Technologies, Inc., Princeton, N.J.

[21] Appl. No.: 274,821

[22] Filed: Jul. 14, 1994

[51] Int. Cl.⁶ .................................................. H03F 1/32
[52] U.S. Cl. ........................ 327/165; 327/178; 327/100; 455/303
[58] Field of Search .................. 381/94, 106; 455/303, 455/304; 327/165, 100, 180, 551, 131, 133, 336, 140, 178, 306, 317

[56] References Cited

U.S. PATENT DOCUMENTS

| | | |
|---|---|---|
| 3,510,640 | 5/1970 | Voelcker, Jr. . |
| 4,090,146 | 5/1978 | Pearce ........................................... 330/2 |
| 4,272,846 | 6/1981 | Muratani et al. ......................... 455/269 |
| 4,286,222 | 8/1981 | Caputo ..................................... 327/233 |
| 4,398,061 | 8/1983 | McMann, Jr. ............................. 333/14 |
| 4,654,871 | 3/1987 | Chaplin et al. ............................ 381/72 |
| 4,672,638 | 6/1987 | Taguchi et al. .......................... 327/167 |
| 4,672,674 | 6/1987 | Clough et al. .............................. 381/71 |
| 4,761,797 | 8/1988 | Bickers ....................................... 375/4 |
| 4,992,754 | 2/1991 | Blauvelt et al. .......................... 330/149 |
| 5,019,722 | 5/1991 | Hess et al. ................................. 327/79 |
| 5,126,687 | 6/1992 | Onoda et al. ............................. 330/149 |
| 5,151,664 | 9/1992 | Suematsu et al. ........................ 330/149 |
| 5,168,526 | 12/1992 | Orban ........................................ 381/94 |
| 5,197,082 | 3/1993 | Uda et al. ................................... 375/4 |
| 5,204,909 | 4/1993 | Cowan ..................................... 381/106 |
| 5,210,607 | 5/1993 | Sakamoto et al. ....................... 358/166 |
| 5,252,930 | 10/1993 | Blauvalt ................................... 327/100 |

OTHER PUBLICATIONS

E. Masry, "The Recovery of Distorted Band–Limited Stochastic Processes" *IEEE Transations on Information Theory*, vol. IT–19, No. 4 pp. 398–403 (Jul. 1973).

J. Sanz, et al., "Discrete and Continuous Band–Limited Signal Extrapolation", *IEEE Transactions on Acoustics, Speech, and Signal Processing*, vol. ASSP–31, No. 5, pp. 1276–1285 (Oct. 1983).

A. K. Katsaggelos, et al., "A Class of Iterative Signal Restoration Algorithms", *IEEE Transactions on Acoustics, Speech, and Signal Processing*, vol. 38, No. 5, pp. 778–786 (May 1990).

B. F. Logan, Jr., "Signals Designed for Recovery After Clipping–I. Localization of Infinite Products", *AT&T Bell Labortories Technical Journal*, vol. 63, No. 2, pp. 261–307 (Feb. 1984).

H. B. Voelcker et al., "Clipping and Signal Determinism: Two Algorithms Requiring Validation", *IEEE Transactions on Communications*, pp. 738–744 (Jun. 1973).

F. A. Marvasti et al., "Reconstruction of Speech Signals with Lost Samples", *IEEE Transactions on Signal Processing*, vol. 40, No. 12, pp. 2897–2903 (Dec. 1992).

Qun Shi, "Impact of Laser Clipping Distortion on Hybrid SCM AM/QAM Lightwave Transmission", *LEOS '93 Conference Proceedings*, pp. 370–371 (Nov. 1993).

QUALCOMM note, "Q2334 Dual Direct Digital Synthesizer", Technical Data Sheet, (Jun. 1988).

*Primary Examiner*—Timothy P. Callahan
*Assistant Examiner*—Dinh T. Le
*Attorney, Agent, or Firm*—Ratner & Prestia

[57] ABSTRACT

A circuit which restores portions of an input signal lost due to clipping distortion includes a comparator which locates the portions of the input signal which have been subject to clipping distortion and generates a pulse signal where each pulse corresponds to a clipped portion of the input signal. This pulse signal is used to generate parabolic pulses which are combined with the input signal to generate a modified signal that approximates the input signal without the clipping distortion. One circuit generates the pulse signals by controlling an oscillator to produce a parabolic pulse train which changes in frequency and amplitude to match each pulse of the pulse signal and then selecting one of the parabolic pulses for each pulse of the pulse signal. Another circuit generates the parabolic pulses by doubly integrating the pulses of the pulse signal.

10 Claims, 9 Drawing Sheets

APPARATUS AND A METHOD FOR RESTORING AN A-LEVEL CLIPPED SIGNAL

BACKGROUND OF THE INVENTION

The present invention relates to apparatus and a method for processing a distorted signal to reduce the effects of the distortion and in particular to such circuitry which processes a signal that has been subject to clipping distortion to recover a replica of the signal without the clipping distortion.

Clipping distortion is a common phenomenon in many types of analog signal processing. It may occur, for example, in an analog voltage amplifier when the potential of the input signal and the gain of the amplifier result in an output signal which would have voltage values that are either above the positive supply voltage or below the negative supply voltage. In these instances, the level of the output signal is limited or "clipped" at the level of the supply.

Another method by which clipping distortion may occur is in a laser modulation system. An example of how this may occur is shown in FIG. 3. This Figure shows the transfer function 310 of a typical semiconductor laser diode as the relationship between input current, I(t), and output optical power, P(t). The input current to the laser diode is biased at a current Ib. Signal variation about Ib causes the diode to produce proportional amounts of optical power. There is a threshold input current, Ith, below which the diode will cease to emit light. As shown in the Figure, when the input current I(t) falls below this threshold, the power output of the laser diode falls below zero and the light signal P(t) is clipped.

One common technique which is used to prevent clipping distortion is to carefully control the amplitude of the input signal or the gain of the system to prevent clipping. One such technique is described in U.S. Pat. No. 5,168,526 to Orban, entitled DISTORTION-CANCELLATION CIRCUIT FOR AUDIO PEAK LIMITING. In the system described in this patent, a voltage controlled attenuator is used to reduce the gain of the system by an amount proportional to a low-pass filtered difference between the input signal and the output signal.

Another technique for restoring a clipped signal is disclosed in U.S. Pat. No. 3,510,640 to Voelker, Jr., entitled METHOD AND APPARATUS FOR INTERPOLATION AND CONVERSION OF SIGNALS SPECIFIED BY REAL AND COMPLEX ZEROS and in a paper by Voelcker et al. entitled "Clipping and Signal Determinism: Two Algorithms Requiring Validation" IEEE Transactions on Communication, June, 1973, pp 738–744. These references describe an iterative technique by which, a clipped signal is analyzed to locate its real and complex zero-crossing points and this data is used to reconstruct the signal irrespective of its actual amplitude values.

A third technique is disclosed in two articles by Logan, Jr. entitled "Signals Designed for Recovery After Clipping—I. Localization of Infinite Products" and "Signals Designed for Recovery After Clipping—II. Fourier Transform Theory of Recovery" ATT Bell Laboratories Technical Journal, vol. 63, no. 2, Feb. 1984 pp 261–306. These articles describe an iterative method by which a class of clipped signals may be recovered using zero-crossing points and either localized exponential functions or Fourier transformation.

These techniques may use significant amounts of memory because they sample the input signal to determine the base points from which interpolation is to be performed and store these samples for analysis. In addition, because of the extensive mathematical analysis performed by some of these techniques, they may not be applicable to real-time signal processing. This is especially true for high-frequency operations, such as recovering information from a radio-frequency (RF) modulated signal produced by a semiconductor laser diode.

SUMMARY OF THE INVENTION

The present invention is embodied in apparatus and a method which corrects clipping distortion in a received signal. Using the inventive method, a replica of the input signal is quantized into a pulse signal which identifies segments that exceed a threshold value. Each pulse of this signal identifies a segment of the received signal which has been clipped. The quantized signal is then used to generate wave segments which approximate the portion of the input signal that was lost due to clipping. These segments are then added to the received signal at locations corresponding to the determined clipped waveforms.

According to one aspect of the inventive method, an amplitude adjustment circuit is included in the circuitry which generates the wave segments to modify the amplitude of these segments as a function of the pulse-width of the quantized signal pulses.

According to another aspect of the inventive method, the wave segments are generated by providing segments of an oscillatory signal having a predetermined geometric form.

According to yet another aspect of the inventive method, the wave segments are generated by doubly integrating the pulses of the quantized signal.

DETAILED DESCRIPTION

Although the subject invention is described in the context of a laser modulation system, it is more generally applicable to other types of electrical and optical systems in which signals are occasionally subject to clipping distortion. These include, for example, demodulation systems used to detect other types of amplitude modulated signals which may experience brief episodes of greater than 100 percent modulation, and audio amplifiers in which signal peaks may be occasionally lost due to clipping distortion.

Figure 1:
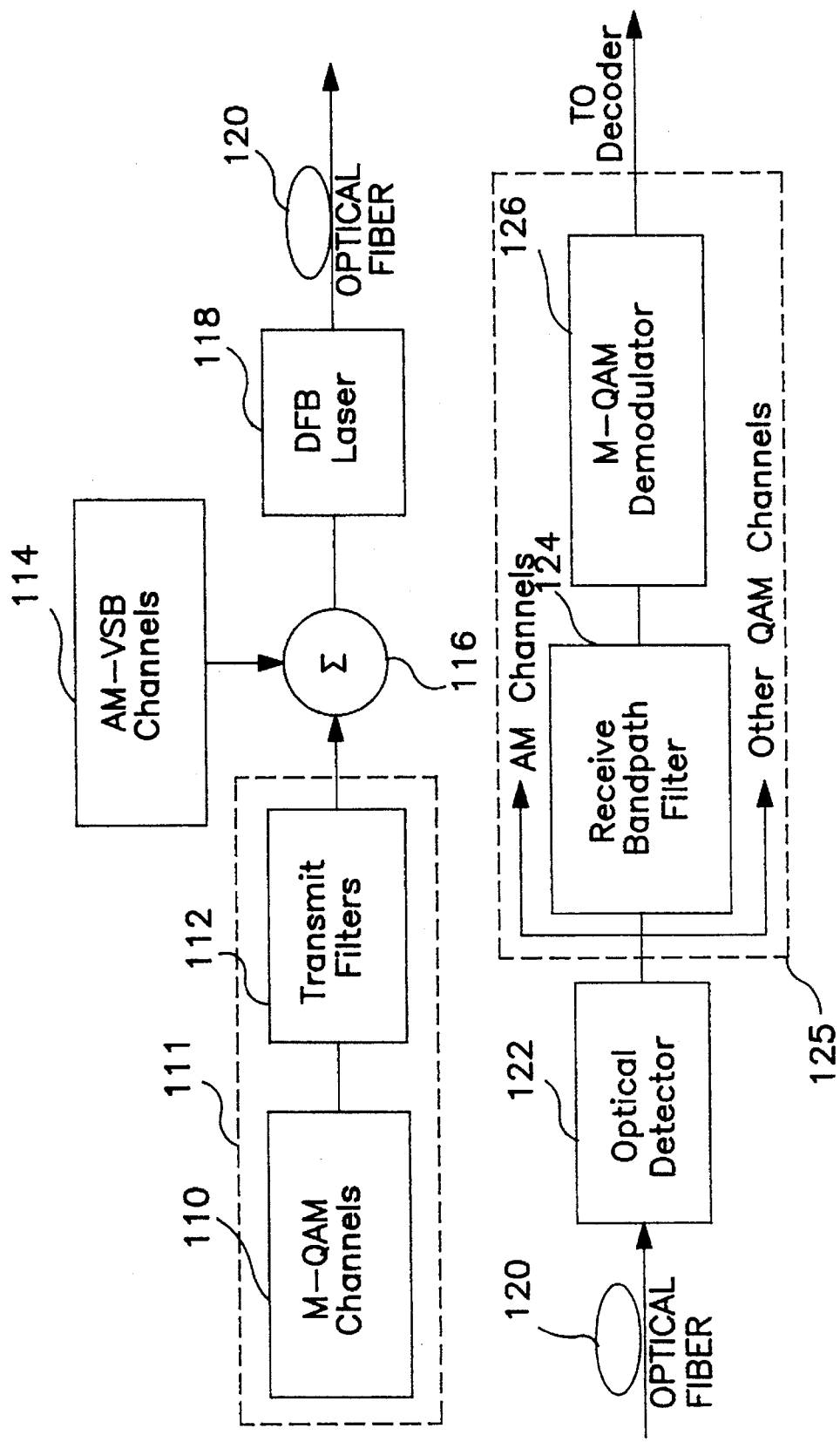
FIG. 1 (prior art) is a functional block diagram of an optical modulation/demodulation system which is useful for describing one environment in which the present invention may be used.

FIG. 1 is a block diagram of a video system in which multiple channels of video information are transmitted over an optical fiber 120 using an laser diode 118. The combined signals are received by an optical detector 122 and processed to recover the originally transmitted signals. In the exemplary embodiment of the invention, the video signals include both conventional analog vestigial sideband amplitude modulated signals, (AM-VSB) provided by a source 114 and digital signals, such as multi-state quadrature amplitude modulated (M-QAM) signals. The digital signals, which are provided by a source 110, may be, for example, 16-QAM or 32-QAM signals and may conform to the transmission standard adopted by the Grand Alliance for high-definition television (HDTV) signals or to similarly encoded NTSC, PAL or SECAM signals.

In this exemplary system, the AM-VSB signals are transmitted in the lower part of the signal spectrum while the M-QAM signals are transmitted in the higher end of the spectrum. A system of this type may, for example, be used in a fiber-optic cable system for delivering programming to consumers from an external cable system or for routing programming within a home, for example, via the fiber-optic consumer electronics bus (CEBus) standard known as FOBus.

As shown in FIG. 1, multiple M-QAM channels, for example 40 six MHz 16-QAM channels, and a like number of six MHz AM-VSB channels may be combined and transmitted over a single optical fiber connection 120. The M-QAM channels are generated by circuitry 111 that includes both the modulators 110, which place the baseband M-QAM channels in the transmission spectrum, and band-shaping filters 112 which reduce out-of-band components of the individual channels to reduce the possibility of interference among the channels. The M-QAM signals are summed with the AM-VSB channels, provided by the source 114, in a summing circuit 116. The output signal from the summing circuit is a current which is used to modulate a laser diode 118. The diode 118 produces laser light that varies in power according the modulating current. This light is transmitted to a receiver via the optical fiber 120.

The light is received from the fiber 120 by an optical detector 122 which converts the optical signal into an electrical signal. The various individual channels are separated from this electrical signal using respective band-pass filters 124, only one of which is shown in FIG. 1. The signal separated by the shown filter 124 is an M-QAM signal which is passed to an M-QAM demodulator to regenerate the digital signal. This digital signal is passed to a decoder (not shown) to reproduce the original video signal. Other M-QAM signals are processed using other demodulators and decoders (not shown). The AM-VSB signals may be routed as a unit, with or without band-shifting, to television receivers equipped to receive standard off-air or cable television signals or they may be demodulated and decoded into component luminance-chrominance or red-green-blue signal combinations for display on a monitor (not shown).

Figure 2:
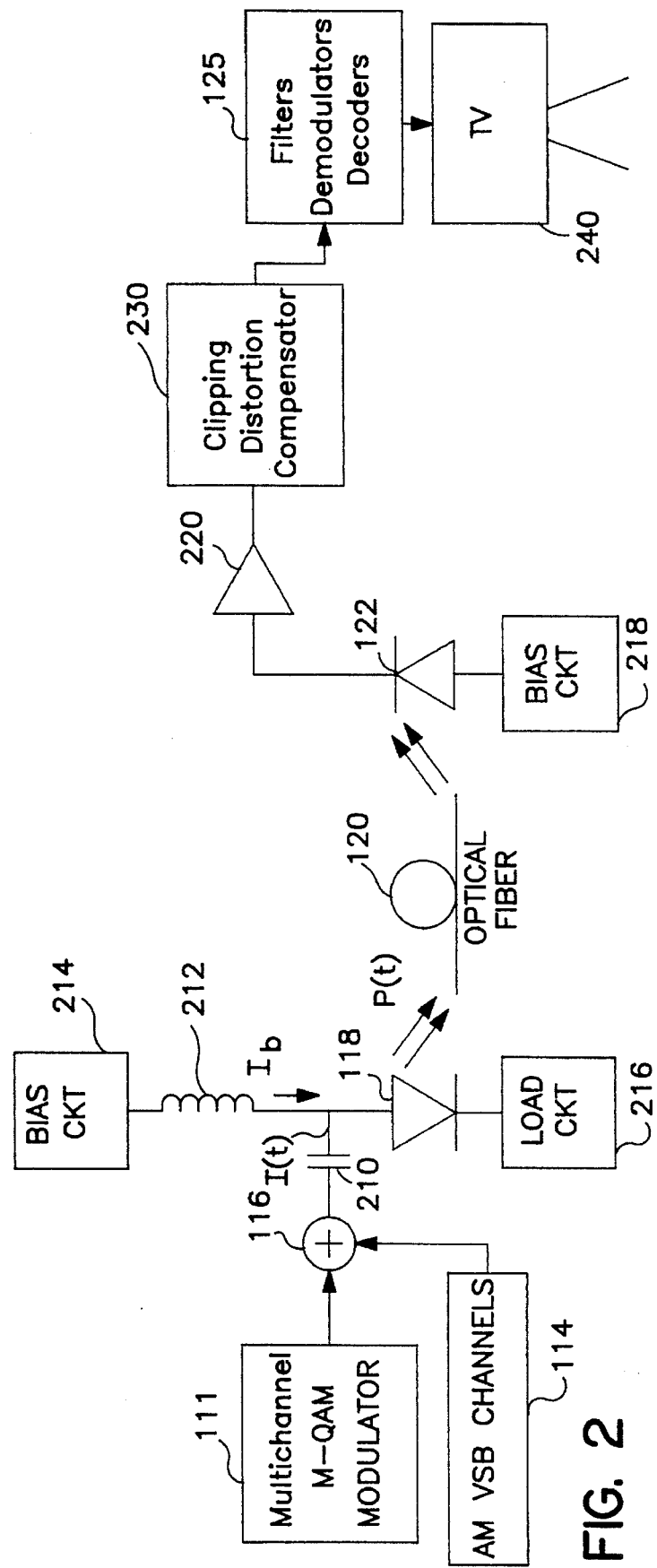
FIG. 2 is a functional block diagram, partly in schematic diagram form of an optical modulation/demodulation system which includes a clipping distortion compensator in accordance with the present invention.

FIG. 2 is a block diagram, partly in schematic diagram form, which shows details of the optical modulation/demodulation circuitry and shows a possible circuit location for a clipping distortion compensator according to the present invention. In the circuitry shown in FIG. 2, the output signal produced by the summing circuit 116 is capacitively coupled to the laser diode 118 via a capacitor 210. The current provided by this capacitor 210 is the current I(t). The diode 118 is forward-biased, through an inductor 212, at a current Ib. This bias current is supplied by a bias circuit 214 from a source of operational potential (not shown). The diode is also coupled to a load circuit 216, which may, for example, isolate the diode from interfering signals which are propagated via a source of reference potential (e.g. ground).

The optical power, P(t), produced by the diode 118 is transmitted through the optical fiber 120 to a photodiode 122. The photodiode is reverse-biased by a bias circuit 218. Responsive to the received optical signal, the diode 122 produces a time-varying potential which is amplified by an amplifier 220 and applied to a clipping distortion compensator 230. The output signal of the compensator 230 is, in turn, applied to circuitry 125 which includes the filters, demodulators and decoders that are used to recover the video signals from the signal provided by the compensator 230. The output signal of the circuitry 125 is applied to a television receiver 240 which regenerates the video signal. As an alternative, it is contemplated that individual clipping distortion compensators may be placed after each band-pass filter such that each video signal is separately compensated for clipping distortion. Alternatively, for a combined analog AM-VSB and digital M-QAM video system as shown in FIG. 1, it is contemplated that the clipping distortion compensator may be placed after the optical detector 122 but before the circuitry 125, such that both the analog and digital signals are compensated for clipping distortion.

Figure 3:
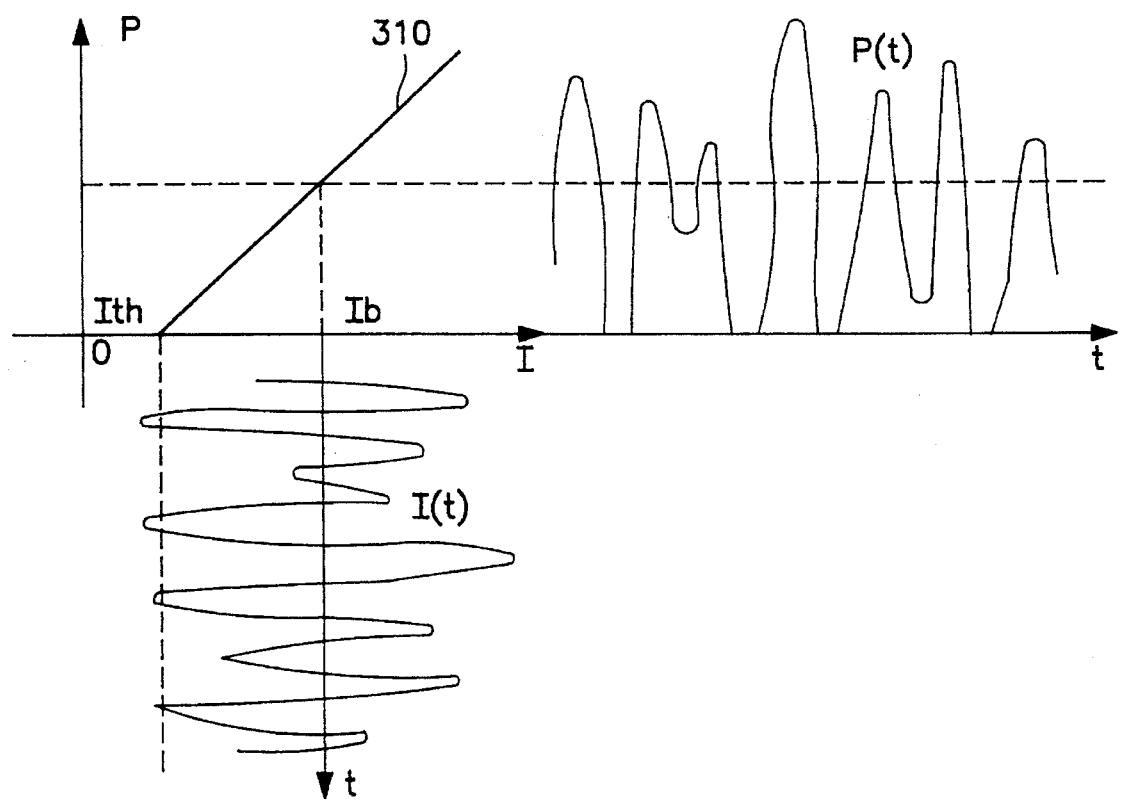
FIG. 3 (prior art) is a graph of optical power versus current which is useful for describing the operation of a semiconductor laser diode.

FIG. 3 is a graph which shows exemplary waveforms for I(t) and P(t) along with an exemplary transfer characteristic 310 for the laser diode 118. In this Figure, the waveform for I(t) represents a composite of multiple modulation components. In the Figure, clipping distortion occurs because the current level of the signal I(t) occasionally decreases to a value less than the threshold current, Ith, for the laser diode 118. Because a large number of signals are being combined, occasional distortion of this type is almost inevitable. It may occur, for example, when multiple superposed waveforms at different frequencies momentarily reenforce each other to produce a current which exhibits a relatively large displacement from the bias current, Ib. The optical output signal of the laser diode 118 exhibits clipped or flattened negative-going peaks because of the transitions of the input current below Ith.

The inventor has determined that as long as the clipping distortion is relatively rare, such that its occurrence may be modeled as a Poisson process, it can be corrected to within a mean squared error of 0.1 percent using a clipping distortion compensation circuit according to the present invention. Briefly, this compensator substitutes a parabolic peak for the clipped portion of the electrical signal recovered from the optical power signal, P(t). The width of the parabolic peak waveform is matched to the detected width of the clipped portion of the waveform. In one embodiment of the invention, the amplitude of the parabolic peak is adjusted as a function of the detected width of the clipped waveform.

Figure 4:
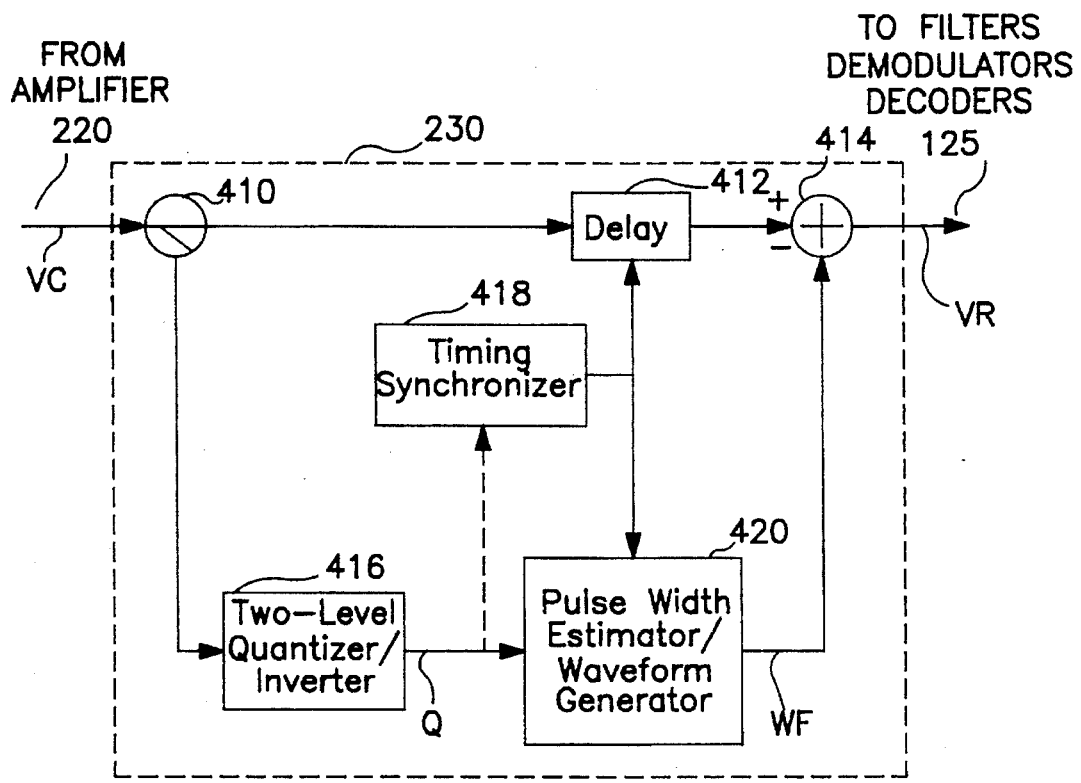
FIG. 4 is a block diagram of a clipping distortion compensator suitable for use in the optical modulator/demodulator shown in FIG. 2.

FIG. 4 is a block diagram of an exemplary clipping distortion compensator, suitable for use as the compensator 230, shown in FIG. 2. In FIG. 4, the signal received from the amplifier 220 is applied to a signal splitter 410 which divides the signal into two identical parts. One part is applied to a compensating delay circuit 412, which compensates this part of the signal for delays in processing the other part of the signal. This other part of the signal is processed by circuitry which includes a two-level quantizer/inverter 416, a pulse width estimator/waveform generator 420 and, optionally, a timing synchronizer 418. This circuitry generates the parabolic pulses which are summed with the delayed first part of the signal in the summing circuitry 414 to generate an output waveform which compensates for a substantial portion of the clipping distortion.

The timing synchronizer 418 is used to adjust the compensating delays such that the correction signals match the clipped signal in timing. When the processing delays are known and fixed for a class of signals, this circuit may be eliminated by taking these fixed delays into account in the design of the circuitry. Alternatively, where different types of signals may be processed and the delays may vary depending on the type of signal being processed, this circuitry may be used to adjust the compensating delays. Once a particular signal is being processed, however, the time delays provided by the compensating delay elements should not be allowed to change. It is contemplated that the timing synchronizer 418 may allow for manual or automatic adjustment of the compensating delays. If automatic adjustment is used, a training signal may be provided to establish the delay times.

Figure 5:
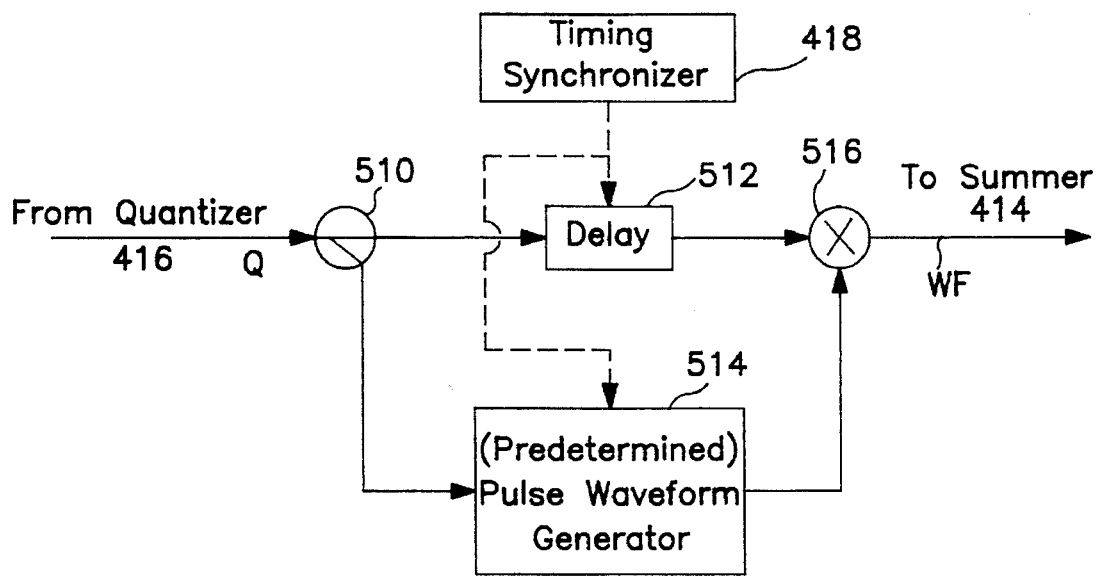
FIG. 5 is a block diagram of a pulse width estimator/waveform generator suitable for use in the clipping distortion compensator shown in FIG. 4.

FIG. 5 shows exemplary circuitry suitable for use as the pulse width estimator/waveform generator circuitry 420. The circuitry shown in FIG. 5 includes a splitter 510 which divides the pulse signal Q into two parts, one which is applied to a compensating delay 512 and another which is applied to a pulse waveform generator 514. As described below with reference to FIGS. 6 and 6a, in response to the signal Q, the waveform generator 514 produces a steady stream of parabolic pulses which are applied to one input terminal of a multiplier circuit 516. As described below with reference to FIGS. 6 and 6a, the pulse width of the parabolic pulses provided by the generator 514 changes to match the changing pulse width of the signal Q. The other input terminal of the multiplier 516 is coupled to receive the delayed signal Q from the delay element 512. The output signal of the multiplier 516 is a signal which is subtracted from the delayed input signal in the subtracter 414 to produce an approximation of the unclipped input signal.

Figure 5A:
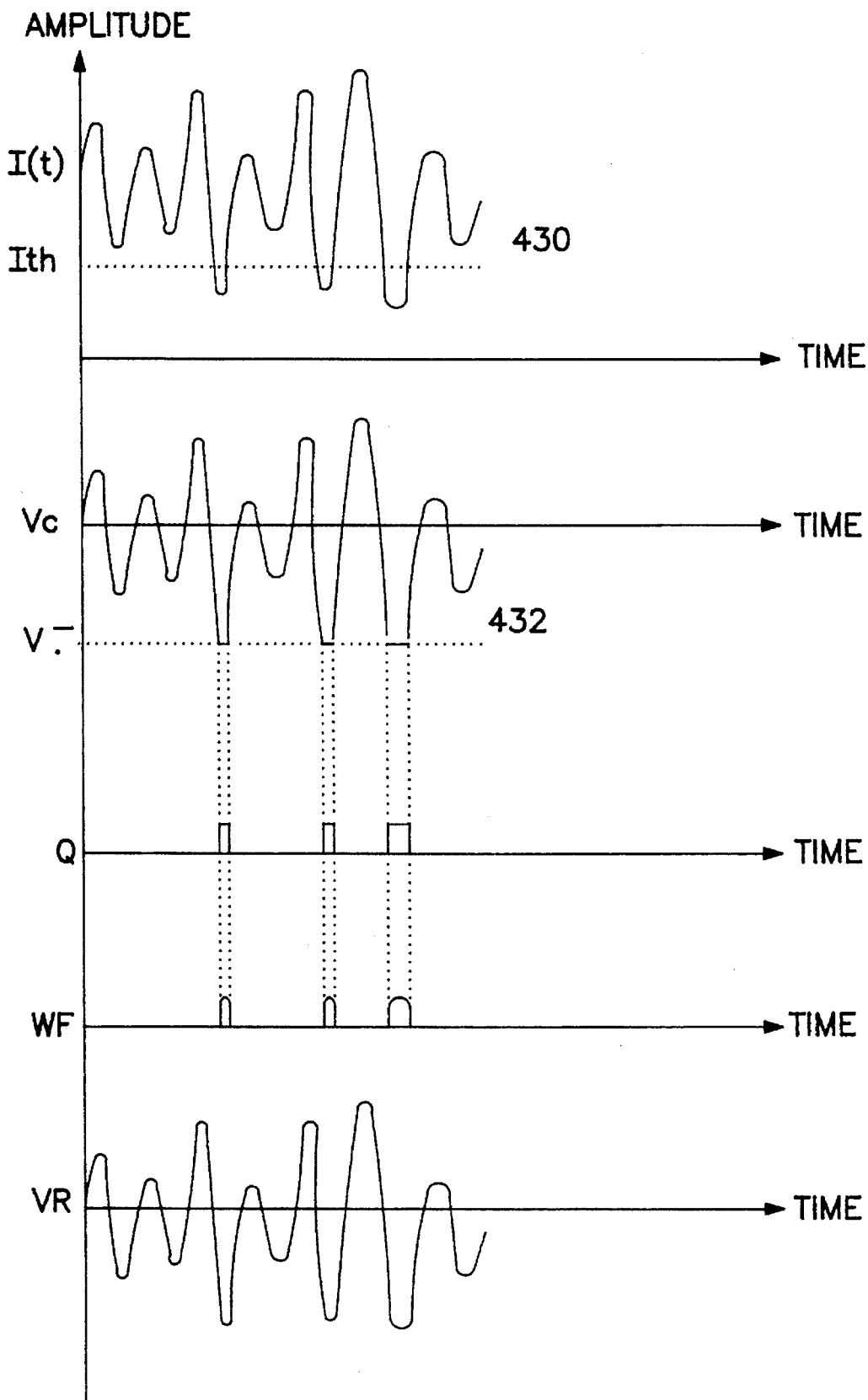
FIG. 5a is a graph of amplitude versus time showing several signals generated by the circuitry shown in FIG. 5, which are useful for describing the operation of the circuitry shown in FIG. 5.

FIG. 5a illustrates several waveforms which are produced by the circuitry shown in FIGS. 4 and 5. For convenience of explanation, the waveforms shown in FIGS. 5a, 6a and 7a are shown as having corresponding components aligned in time. In an actual implementation, however, these components would be skewed relative to one another to reflect processing delays through various components of the circuit. These processing delays are compensated for by the delay elements 412, 512, 610, 714 and 718. One of ordinary skill in the art could readily design circuitry which uses these delay elements to compensate for processing delays in the circuitry.

The waveform I(t), shown in FIG. 5a, represents the current signal I(t) applied to the laser diode 118 by the circuitry shown in FIG. 2. As indicated by the dashed line 430, a portion of the waveform is lost due to clipping distortion. Thus, the waveform which is applied to the splitter 410 is the clipped waveform, $V_c$. This waveform is processed by the two-level quantizer/inverter circuit 416 to generate the pulse waveform Q, which has a pulse corresponding to each clipped portion of the waveform $V_c$. In the exemplary embodiment of the invention, the circuit 416 may include, for example, a comparator (not shown) which compares the signal $V_c$ to a potential $V^-$ (illustrated by the dashed line 432) that is slightly greater than the potential of the clipped portion of the waveform $V_c$. This comparator produces a logic-one output signal when $V^-$ is greater than $V_c$ and a logic-zero output signal otherwise.

The signal Q is applied to the pulse width estimator/waveform generator circuitry 514, which generates parabolic waveforms that span the pulses of the signal Q. As described above, the signal Q is also applied to the multiplier 516. Since the signal Q is zero-valued except where the input waveform has been clipped, The multiplier acts to select one of the pulses provided by the waveform generator 514 to be added to the input signal as an approximation of the information lost due to the clipping of the input signal.

Figure 6:
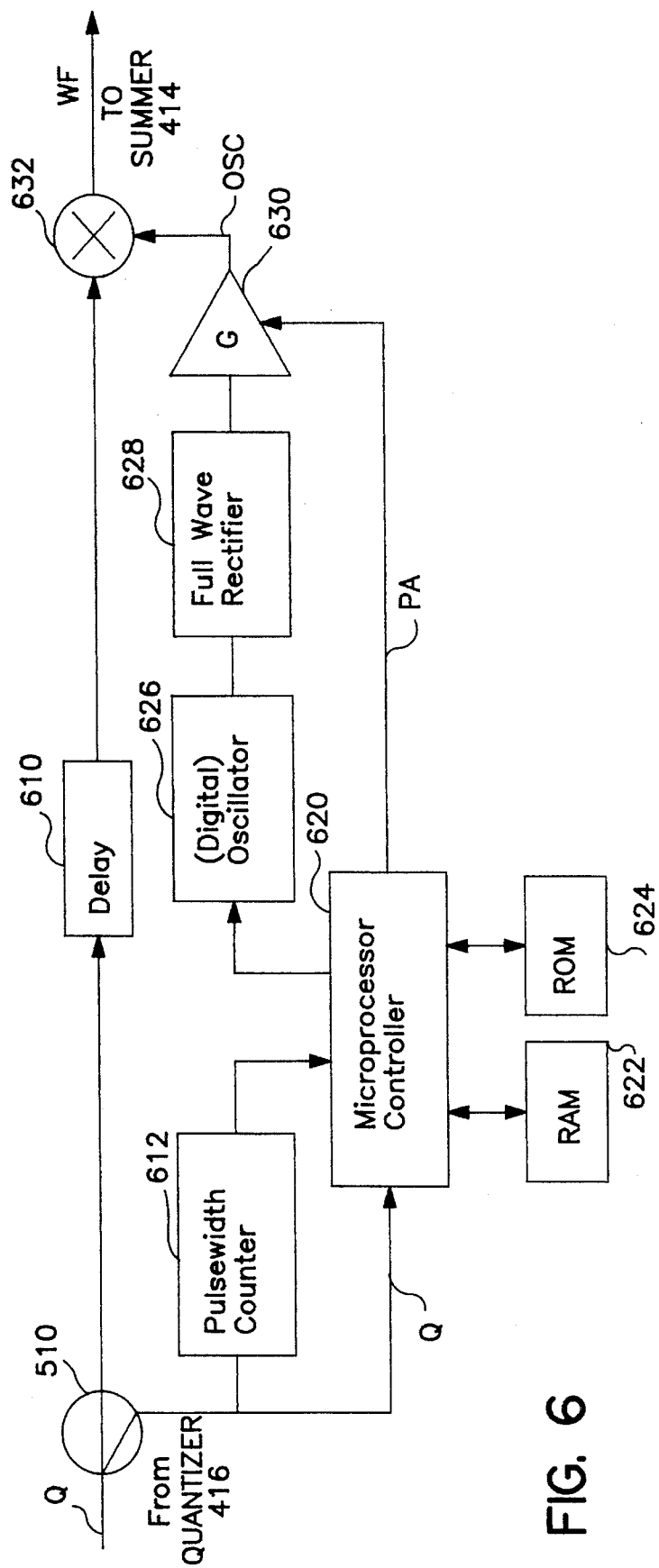
FIG. 6 is a block diagram of circuitry suitable for use as the pulse waveform generator shown in FIG. 5.
Figure 6A:
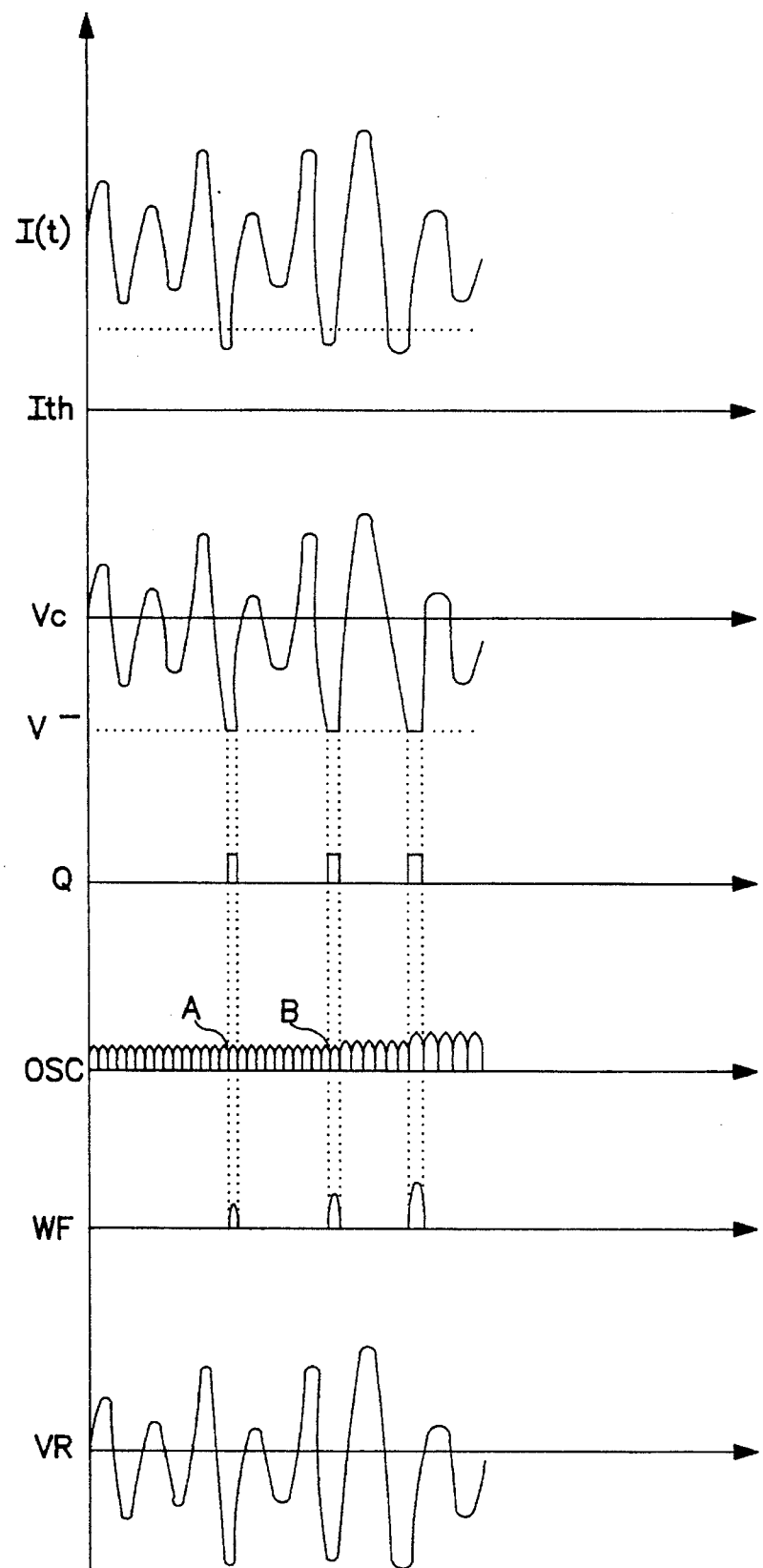
FIG. 6a is a graph of amplitude versus time showing several signals generated by the circuitry shown in FIG. 6, which are useful for describing the operation of the circuitry shown in FIG. 6.

FIG. 6 is a block diagram which shows details of circuitry suitable for use as the pulse waveform generator 514. The waveform generator shown in FIG. 6 is a digital implementation which may use high performance devices to correct signal clipping at frequencies in the 1000 MHz range. More standard components may be used for other applications, such as to correct clipping distortion in a 6 MHz baseband video signal or to correct distortion caused by an audio amplifier.

In FIG. 6, the output signal of the splitter 510 is applied to a pulsewidth counter and to a microprocessor controller 620. The microprocessor 620 includes a read only memory (ROM) 624 which holds control program information and a random access memory (RAM) 622 which is used as a scratchpad memory for storing temporary results.

The signal Q is applied to the controller 620 to indicate that a clipped waveform has been detected, while the output value provided by the pulse width counter 612 indicates a time interval over which clipping was detected. The microprocessor controller uses the pulse width value to control the frequency of a digital oscillator 626. The digital oscillator 626 may be, for example, a Q2334 Direct Digital Synthesizer, available from Qualcomm, Inc.

Briefly, a digital oscillator of this type accumulates a programmed value in a phase accumulation register. The values produced in the phase accumulation register, which represent a stepped sawtooth wave are applied as addresses to a read only memory (ROM). The ROM is programmed to provide values of a sinusoidal waveform in response to input sawtooth waveform. Thus the output signal provided by the digital oscillator is a sampled sinusoidal waveform.

In this embodiment of the invention, the contents of the ROM may be modified such that a sampled data waveform having parabolic peaks is provided. An example of such a waveform may be, for example, a hyperbolic sine function. The digital oscillator 626 also includes a digital-to-analog converter (not shown) and a low-pass filter (not shown) so that the output signal of the digital filter is an analog signal which is substantially free of harmonic components and sampling artifacts.

The signal generated by the digital oscillator 626 is applied to a full-wave rectifier 628 to generate an output signal having the form of the waveform OSC shown in FIG. 6a. The full wave rectifier 628 is optional. If it is omitted, its function may be incorporated in the digital oscillator, or, alternatively, a half-wave rectifier may be substituted.

The output signal, OSC, of the full wave rectifier 628 is applied to a controlled amplifier 630 which is responsive to a signal PA, provided by the microprocessor controller 620. The controller 620 changes the gain of the amplifier 630 to change the amplitude of the waveform OSC. In the exemplary embodiment of the invention, the amplitude of the waveform is changed in proportion to the pulse width of the signal Q.

The output signal of the amplifier 630 is the signal which is applied to the multiplier 516 to generate the augmenting pulses of the signal WF. As described above with reference to FIG. 4, the signal WF is subtracted from the clipped input signal by the subtracter 414 to generate a signal which approximates the original unclipped signal.

FIG. 6a shows several of the signals generated by the circuitry shown in FIG. 6. In particular, the signal I(t) is the original unclipped waveform which is used to modulate the laser. The signal Vc is the clipped waveform that is received by the apparatus shown in FIG. 6. As shown in FIG. 6a, the most negative peaks of this waveform have been clipped. The signal Vc is compared to a reference voltage level $V^-$ to generate the quantized signal Q which has pulses corresponding to the clipped portions of the signal Vc.

In response to the signal Q, the pulsewidth counter 612 indicates a pulse width for each of the clipped peaks of the signal Vc and the microprocessor controller 620 generates control signals for the digital oscillator 626. In response to these signals, the oscillator 626, full wave rectifier 628 and controlled amplifier 630 generate the signal OSC which changes in frequency in inverse proportion to changes in the pulse width of the signal Q and changes in amplitude in proportion to changes in the pulse width of the signal Q.

It is noted that at points A and B of the signal OSC shown in FIG. 6a, the signal exhibits discontinuities. These discontinuities correspond to the receipt of pulses of the signal Q by the microprocessor controller 620. Upon receiving a pulse, the controller 620 generates a signal which resets the phase of the digital oscillator 626, such that the output pulses of the signal OSC have a fixed phase relationship with the pulses of the signal Q. This phase relationship ensures that the pulses of the signal WF match the clipped portions of the delayed signal Vc when they are combined by the subtracter 414.

The final waveform shown in FIG. 6a is the reconstructed signal VR, which is the delayed and clipped signal Vc augmented by an inverted signal WF.

Although the circuitry shown in FIG. 6 is shown as including a microprocessor controller 620, it is contemplated that a custom controller formed from digital logic elements may be substituted for the microprocessor or that an analog circuit may be substituted which generates appropriate control voltages in response to the occurrence and pulse width of pulses of the signal Q.

In the analog implementation, an analog voltage controlled oscillator (VCO) would be substituted for the digital oscillator 626 and a voltage controlled amplifier (VCA) would be substituted for the amplifier 630. The control circuitry would generate a control voltage for the VCO which is inversely proportional to the pulse width of a pulse of the signal Q and a control signal for the VCA which is directly proportional to the pulse width of a pulse of the signal Q. In addition, in order to allow time for the VCO to stabilize, a longer delay may be implemented in the delay element 512 or 610. This type of analog implementation may be advantageous for handling relatively high frequency signals.

It is also contemplated that a hybrid of the analog and digital implementations may be used to increase the frequency of the signals that may be handled by the system while maintaining digital control circuitry. In this hybrid implementation, the digital oscillator 626 would be replaced by a VCO and the controlled amplifier would be replaced by a VCA. The digital controller 620 in this embodiment would generate analog control signals, using digital to analog converters which are applied to the VCO and VCA as described above with reference to the analog embodiment.

Figure 7:
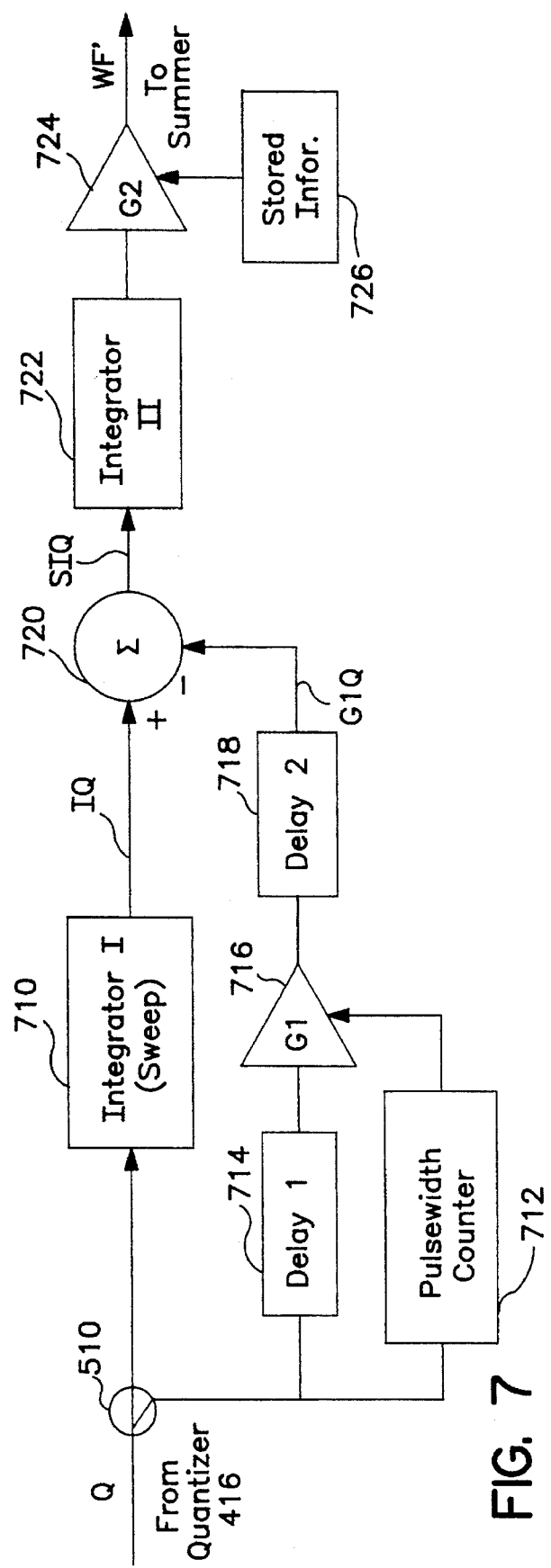
FIG. 7 is a block diagram of alternative circuitry suitable for use as the pulse waveform generator shown in FIG. 5.
Figure 7A:
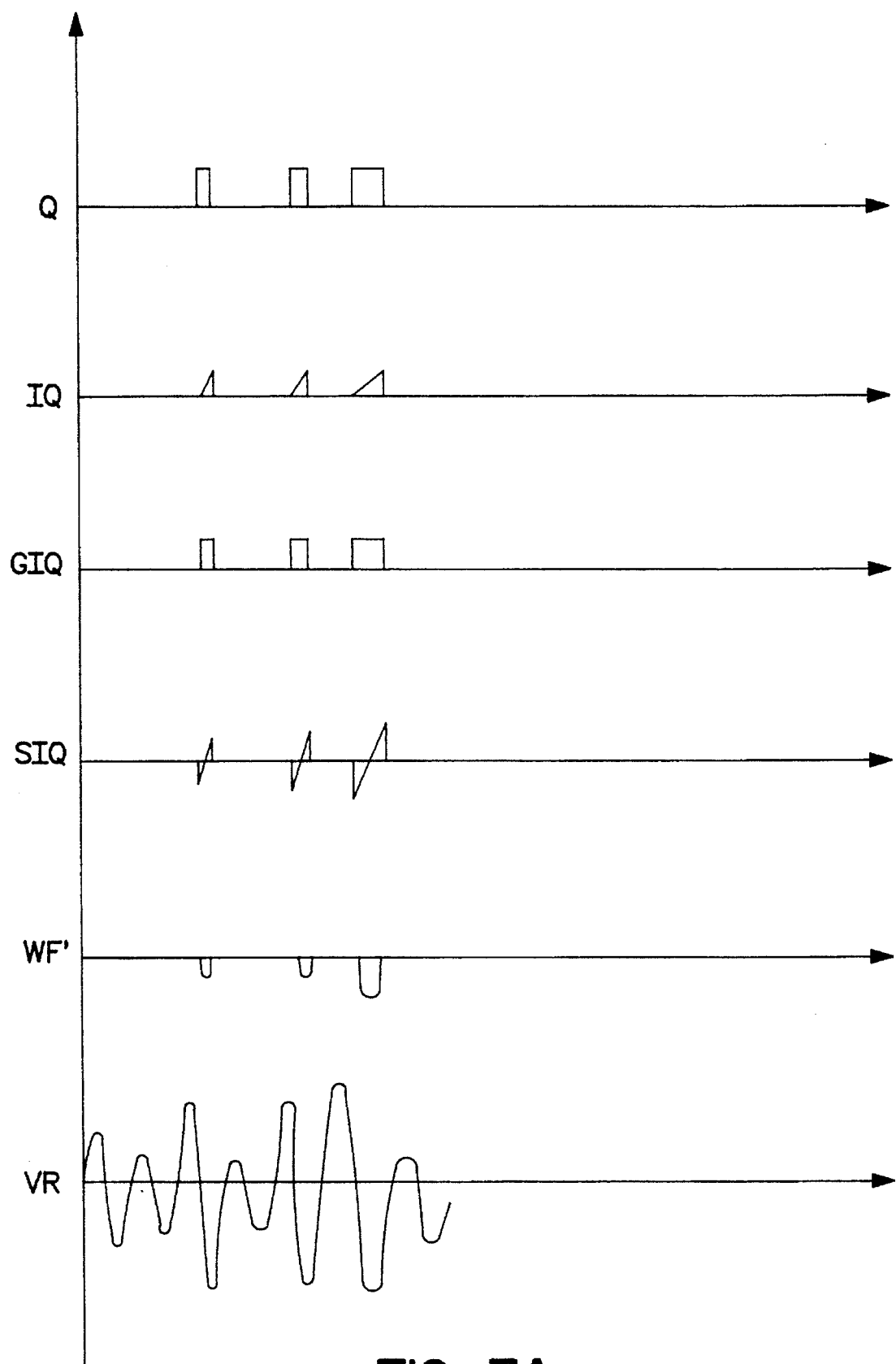
FIG. 7a is a graph of amplitude versus time showing several signals generated by the circuitry shown in FIG. 7, which are useful for describing the operation of the circuitry shown in FIG. 7.

FIG. 7 is a block diagram of another alternative embodiment of the pulse width estimator/waveform generator 420, shown in FIG. 4. This alternative embodiment generates the parabolic pulses of a signal WF' by double integration of the signal Q. FIG. 7a shows waveforms that are useful for describing the operation of the circuitry shown in FIG. 7.

As shown in FIG. 7, the signal Q is provided in parallel by the splitter 510 to a sweep integrator 710, a pulse width counter 712 and a delay element 714. The sweep integrator 710 integrates each pulse of the signal Q to generate a signal IQ which has a saw-tooth pulse, as shown in FIG. 7a, corresponding to each square pulse of the signal Q. The pulse width counter 712 controls the gain of an amplifier 716, which is coupled to receive the delayed signal Q from the delay element 714. The gain of the amplifier 712 is controlled to be proportional to the pulse width of the pulses of the signal Q. The proportionality constant is determined by the gain of the sweep integrator 710. The goal of this circuitry is to produce a modified signal G1Q which, when subtracted from the signal IQ, produces triangular pulses such as those shown by the waveform SIQ in FIG. 7a. These pulses have substantially equal positive and negative swings. The signal SIQ is generated by a subtracter 720 which subtracts a delayed version of the signal G1Q, provided by the delay element 718, from the signal IQ provided by the sweep integrator 710.

The output signal SIQ of the subtracter 720 is shown as the waveform SIQ of FIG. 7a. The signal SIQ is integrated by a second integrator 722 to produce a signal having parabolic pulses. The output signal of the integrator 722 is then amplified by an amplifier 724 to produce the signal WF'. The amplifier 724 is responsive to stored information concerning the type of signal being processed by the system to generate a signal which is constant-valued for a particular signal. This signal controls the gain of the amplifier 724. In the exemplary embodiment of the invention, the gain, G2, of the amplifier 724 is determined by equation (1).

$$G2 = \left( \frac{\dot{\sigma}}{\sigma} \right)^2 A = 4\pi^2 \frac{fb^3 - fa^3}{3(fb - fa)} A \qquad (1)$$

In this equation, $\sigma^2$ is the power of the input signal, $\dot{\sigma}^2$ is the power of the first derivative of the input signal, fa is the lower margin frequency of the spectrum of the input signal, fb is the upper marginal frequency spectrum of the input signal, and A is the clipping level. Because this information is known and fixed for each input signal, it is contemplated that the stored information block 726 may be a source of constant potential, or, alternatively, that the amplifier 624 may be configured to have the proper gain for the input signal.

It is noted that, because the signal WF' produced by the amplifier 724 has a negative polarity, the subtracter 414, shown in FIG. 4 would become an adder if the circuitry shown in FIG. 7 were used as the pulse width estimator/waveform generator 420.

While the invention has been described in terms of an exemplary embodiment, it is contemplated that it may be practiced as outlined above within the spirit and scope of the appended claims.

The invention claimed is:

1. Apparatus which corrects clipping distortion in a received signal, whereby portions of a transmitted signal are lost in the received signal, the apparatus comprising:

an input terminal for receiving the received signals;

a quantizer circuit, coupled to the input terminal, which detects the clipping distortion in the received signal and which generates a pulse signal, wherein each pulse of the pulse signal corresponds to a respectively different portion of the received signal which portion has been subject to the clipping distortion;

waveform generating means, coupled to the quantizer circuit and responsive to the pulse signal, including means for generating wave segments which approximate the portions of the received signal that were lost as a result of the clipping distortion;

means for combining the generated wave segments and the received signal to produce an output signal, at an output terminal, which output signal approximates the transmitted signal.

2. Apparatus according to claim 1, wherein the means for combining the generated wave segments and the received signal includes:

a timing synchronizer;

a delay, coupled to the timing synchronizer, which delays the received signal in time to match the generated wave segments to the portions of the received signal that were lost as a result of the clipping distortion; and means for additively combining the generated wave segments and the delayed received signal to produce the output signal.

3. Apparatus according to claim 1, wherein the waveform generator further comprises:

means for determining a pulse width value for each pulse of the pulse signal generated by said quantizer circuit;

an amplitude adjustment circuit coupled to the pulse width determining means and to the wave segment generating means to receive the wave segments generated by said wave segment generating means which modifies the wave segments in amplitude as a function of the respective pulse-width values.

4. Apparatus according to claim 1, wherein the waveform generating means includes:

an oscillator which produces an oscillatory signal including a plurality of pulses, each of said pulses having a parabolic waveform; and means, coupled to the quantizer circuit and to the oscillator and responsive to the pulse signal generated by said quantizer circuit for selecting portions of the oscillatory signal as respective ones of the wave segments.

5. Apparatus according to claim 1, wherein the waveform generating means includes:

a first integrator which integrates each pulse of the pulse-signal generated by said quantizer circuit to produce a ramp signal having a plurality of ramp pulses, each ramp pulse corresponding to a respectively different one of the pulses of the pulse signal;

a second integrator which integrates the ramp pulses of the ramp signal to produce the wave segments.

6. A method for correcting clipping distortion in a received signal, whereby portions of a transmitted signal are lost in the received signal, the method comprising the steps of:

generating a pulse signal, responsive to the received signal, wherein each pulse of the pulse signal corresponds to a respectively different portion of the received signal which portion has been subject to the clipping distortion;

generating wave segments, responsive to the pulse signal, which wave segments approximate the portions of the received signal that were lost as a result of the clipping distortion; and combining the generated wave segments and the received signal to produce an output signal which approximates the transmitted signal.

7. A method according to claim 6, further comprising the step of delaying the received signal to align the wave segments with the respective portions of the received signal which have been subject to clipping distortion before combining the generated wave segments and the received signal.

8. A method according to claim 7, further comprising the steps of:

determining a pulse width value for each pulse of the pulse signal based upon the duration in time of each pulse; and modifying each of the wave segments in amplitude as a function of the respective pulse-width value.

9. A method according to claim 8, wherein the step of generating wave segments includes the steps of:

generating an oscillatory signal including a plurality of pulses, each of said pulses having a parabolic waveform; and selecting portions of the oscillatory signal as respective ones of the wave segments, the portions being selected responsive to respective pulses of the pulse signal.

10. A method according to claim 8, wherein the step of generating wave segments includes the steps of:

integrating each pulse of the pulse signal to produce a respective ramp pulse of a ramp signal; and integrating each ramp pulse of the ramp signal to produce a respective one of the wave segments.

* * * * *